United States Patent [19]

Ishii

[11] Patent Number: 4,476,444
[45] Date of Patent: Oct. 9, 1984

[54] POWER AMPLIFIER CIRCUIT

[75] Inventor: Satoshi Ishii, Tokyo, Japan

[73] Assignee: Pioneer Electronic Corporation, Tokyo, Japan

[21] Appl. No.: 374,659

[22] Filed: May 4, 1982

[30] Foreign Application Priority Data

May 6, 1981 [JP] Japan ............................ 56-67953

[51] Int. Cl.³ .......................................... H03F 3/30
[52] U.S. Cl. ............................... 330/297; 330/265; 330/267
[58] Field of Search ............... 330/265, 267, 268, 271, 330/273, 274, 297

[56] References Cited

U.S. PATENT DOCUMENTS 4,217,556  8/1980  Ito et al. ................. 330/297 X

FOREIGN PATENT DOCUMENTS 56-2713  1/1981  Japan ................................ 330/297

OTHER PUBLICATIONS

Garde, "Schemes for Increased Output-Voltage Swing From Operational Amplifiers," *Electronics Letters*, vol. 13, No. 4, pp. 111–112, Feb. 17, 1977.
Tanaka, "New Biasing Circuit for Class B Operation," *J. Audio Eng. Soc.*, vol. 29, No. 3, Mar. 1981, pp. 148–152.

Primary Examiner—James B. Mullins
Attorney, Agent, or Firm—Sughrue, Mion, Zinn, Macpeak, and Seas

[57] ABSTRACT

A power amplifier circuit comprises a class A amplifier having a pair of output amplifying devices responsive to an input for driving a load, a power supply connected between power supply terminals of the output amplifying devices for producing a voltage, and a class B power amplifier driven by the input to the class A amplifier. The class B power amplifier includes a pair of push-pull output amplifying devices having outputs connected respectively to the power supply terminals, and a pair of drivers for driving the push-pull output amplifying devices. The drivers have first controlled electrodes for driving the push-pull output amplifying devices and second controlled electrodes connected to a common potential point. A negative feedback loop may be connected for supplying signals dependent upon voltage changes at the power supply terminals back to an input stage of the class B power amplifier.

12 Claims, 6 Drawing Figures

POWER AMPLIFIER CIRCUIT

BACKGROUND OF THE INVENTION

The present invention relates to a power amplifier circuit, and more particularly to a power amplifier circuit for use in audio devices.

Amplifiers for delivering output power to loudspeakers or other loads include class A and class B power amplifiers. Class A amplifiers have a pair of output amplifying devices which are in their active region throughout the entire signal cycle. Since the output amplifying devices do not operate below a cutoff bias value, the class A amplifiers suffer from no switching distortion. However, the bias currents are required irrespective of whether input signals are applied or not, and hence the class A amplifiers undergo high heat loss. Class B amplifiers, on the other hand, require a smaller bias current and are subject to reduced heat loss as compared with class A amplifiers. However, class B amplifiers suffer from switching distortion as the output amplifying devices operate alternately below the cutoff bias value.

There has been proposed a circuit arrangement designed to utilize the advantages, but eliminate the disadvantages of both class A and B amplifiers, as disclosed in U.S. Pat. No. 4,217,556.

The disclosed amplifier circuit comprises a class A push-pull amplifier circuit for signal amplification and a class B push-pull amplifier circuit for power supply amplification. The class B push-pull amplifier circuit includes a pair of driver transistors which are required to have a large dielectric strength due to the wide range of operating voltages. This prior amplifier circuit is also disadvantageous in that the negative feedback loop in the class B push-pull amplifier circuit tends to become unstable in operation, and undergoes oscillation when the parasitic capacitance in the transistors varies to a large extent. Furthermore, the high-frequency characteristics of the open loop in the class B push-pull amplifier circuit are subject to large changes due to the signal amplitudes when the cutoff frequency of the transistors is lowered as the latter are nearly saturated. Increased phase compensation in the class B push-pull amplifier circuit to avoid the above difficulties would lead to different frequency characteristics of the class A and B amplifiers circuits, causing malfunctioning of the amplifier circuit.

SUMMARY OF THE INVENTION

It is an object of the present invention to provide a power amplifier circuit including a class B amplifier having output amplifying devices as a driver, which can operate in a small voltage range for improved operating characteristics of the power amplifier circuit.

According to the present invention, a power amplifier circuit includes a class A amplifier for amplifying an input signal and a class B amplifier for power supply amplification for the class A amplifier, the class B amplifier having a pair of output amplifying devices, and a pair of amplifying devices acting as a driver for driving the output amplifying devices. The driver or the amplifying devices include controlled electrodes for producing outputs to drive the output amplifying devices, and other controlled electrodes such as emitters connected to a common potential. In another embodiment, the power amplifier circuit additionally includes a negative feedback loop for supplying signals responsive to potential changes at the power supply terminals of the other amplifying devices of the class A amplifier back to an input stage of the class B amplifier.

The above and other objects, features, and advantages of the present invention will become more apparent from the following description when taken in conjunction with the accompanying drawings in which certain preferred embodiments are shown by way of illustrative example.

DETAILED DESCRIPTION OF THE PREFERRED EMBODIMENTS

Figure 1:
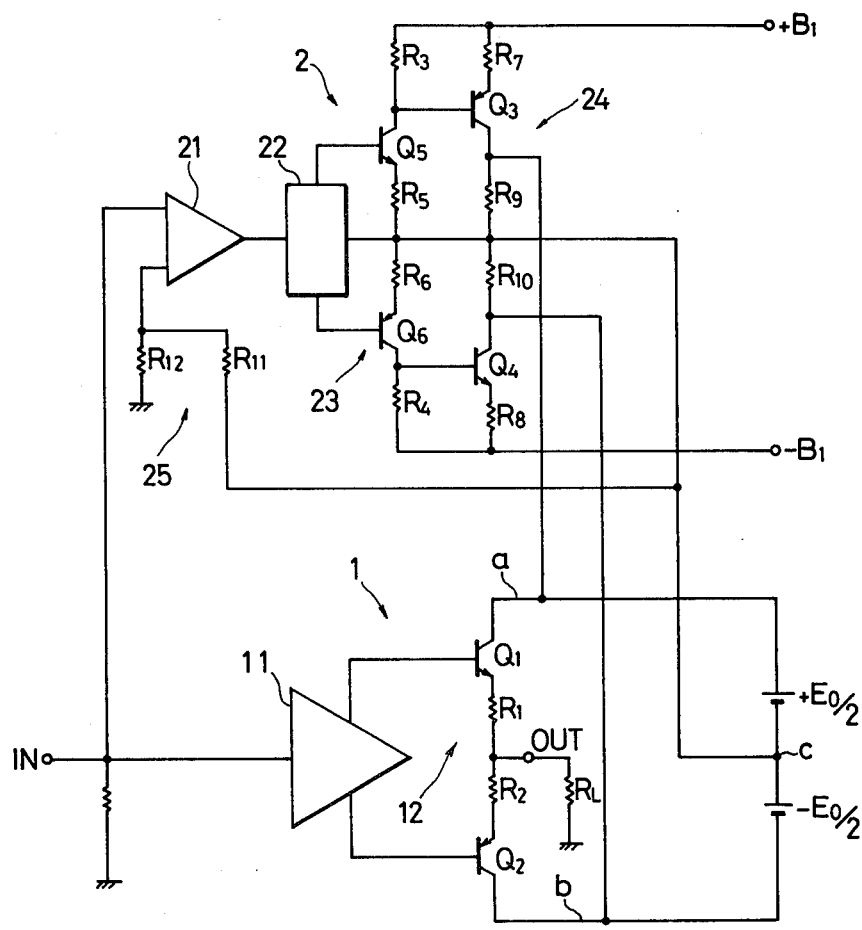
FIG. 1 is a circuit diagram of a conventional power amplifier circuit.

FIG. 1 shows a conventional power amplifier circuit as disclosed in U.S. Pat. No. 4,217,556. The disclosed power amplifier circuit includes a class A push-pull amplifier 1 having a voltage amplifier circuit 11 for amplifying the voltage of an input signal supplied through an input terminal IN, and an output power amplifier circuit 12 composed of a pair of complementary transistors $Q_1$, $Q_2$ which are drivable in a class A push-pull mode by the amplified outputs from the voltage amplifier circuit 11. Outputs from the emitters of the transistors $Q_1$, $Q_2$ are supplied via resistors $R_1$, $R_2$ to a common load $R_L$ to drive the latter.

The transistors $Q_1$, $Q_2$ have collector terminals a, b between which there are connected in series a pair of floating power supplies $+E_0/2$, $-E_0/2$ for applying voltages to the collectors of the transistors $Q_1$, $Q_2$, the potential difference between the collectors being approximately $E_0$ (V).

The power amplifier circuit 1 also includes a class B push-pull amplifier 2 for power supply amplification. The amplifier 2 has a voltage amplifying stage 21 to which the input from the input terminal IN is supplied, a biasing stage 22, a driver stage 23 having a pair of driver transistors $Q_5$, $Q_6$ for amplifying the output delivered from the voltage amplifying stage 21 through the biasing stage 22, and a push-pull power amplifying stage 24 composed of a pair of complementary transistors $Q_3$, $Q_4$ drivable in a class B push-pull mode by the outputs of the driver stage 23.

The driver transistor $Q_5$, $Q_6$ have collectors connected respectively to power supplies $+B_1$, $-B_1$ through corresponding resistors $R_3$, $R_4$ for supplying outputs to the bases of the output transistors $Q_3$, $Q_4$, respectively. The driver transistors $Q_5$, $Q_6$ also have respective emitters connected via resistors $R_5$, $R_6$ to each other and to an intermediate point c between the power supplies $+E_0/2$, $-E_0/2$. The output transistors $Q_3$, $Q_4$ have emitters coupled via resistors $R_7$, $R_8$ respectively to the power supplies $+B_1$, $-B_1$ and collectors coupled via resistors $R_9$, $R_{10}$ to each other and to the intermediate point c. Outputs from the collectors of the output transistors $Q_3$, $Q_4$ are delivered to the collector terminals a, b of the output transistors $Q_1$, $Q_2$, respectively. A negative feedback loop is formed by a feedback circuit 25 having resistors $R_{11}$, $R_{12}$, which is connected between the intermediate point c and an input of the voltage amplifying stage 21 of the class B amplifier 2.

Figure 2A:
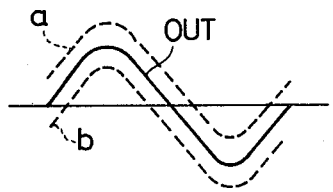
FIGS. 2A and 2B are graphs showing signal waveforms, as explanatory of the operation of the power amplifier circuit of FIG. 1.

The operation of the power amplifier circuit shown in FIG. 1 is as follows: The amplifier 2 is supplied with the input signal from the input terminal IN. One of the output transistors $Q_3$, $Q_4$ of the push-pull power amplifier 24 is energized at a given time dependent upon the polarity of the input signal applied. The collector output of the transistor $Q_3$ or $Q_4$, which is dependent on the input signal, is applied to the collector terminal a or b of the output transistor $Q_1$ or $Q_2$ of the class A amplifier 1. The output signal OUT and the voltages at the collector terminals a, b of the transistors $Q_1$, $Q_2$ have waveforms as shown in FIG. 2A. The output transistors $Q_1$, $Q_2$ operate in an active region at all times, between the levels determined by the power supply voltages $+B_1$, $-B_1$ of the amplifier 2. The voltage $V_{CE}$ between the collector and emitter of each of the transistors $Q_1$, $Q_2$ is rendered quite small. As a result, the power amplifier circuit illustrated in FIG. 1 consumes much less power than prior class A amplifiers, and suffers from no switching distortion.

Consideration will now be given to the voltage developed between the collector and emitter of each of the driver transistors $Q_5$, $Q_6$ of the amplifier 2. The output transistor $Q_3$ and the driver transistor $Q_5$, and the output transistor $Q_4$ and the driver transistor $Q_6$, are connected respectively as inverted Darlington pairs, with the emitters of the driver transistors $Q_5$, $Q_6$ connected to the intermediate point c between the floating power supplies $+E_0/2$, $-E_0/2$. When the input of the base of the transistors $Q_5$ is negative to de-energize the latter, the transistor $Q_6$ is energized to turn on the transistor $Q_4$, whereupon the collector terminal b of the transistor $Q_2$ is rendered negative dependent upon the conduction level of the transistor $Q_4$. Since the voltage at the collector terminal b can go to the maximum level of $-B_1$, the voltage $-B_1+E_0/2=-B_1$ is also applicable to the intermediate point c. Therefore, the collector-to-emitter voltage of the driver transistor $Q_5$, and likewise the driver transistor $Q_6$, can range from about 0 (V) to $2 \times B_1$ (V), a condition which requires that these driver transistors have a large dielectric strength.

Such a large change in the collector-to-emitter voltage $V_{CE}$ results in an increased fluctuation in the collector-to-base voltage $V_{CB}$. There is a tendency for a parasitic capacitance $C_{ob}$ between the collector and base of a transistor to become large with an increasing collector-to-base voltage $V_{CB}$, and the parasitic capacitance $C_{ob}$ varies nonlinearly with the collector-to-base voltage $V_{CB}$. Therefore, the parasitic capacitance $C_{ob}$ is greatly variable with the applied input signal. A variation in the parasitic capacitance $C_{ob}$ can adversely affect the frequency-phase characteristics of the closed negative feedback loop to the point where the negative feedback loop formed by the negative feedback circuit 25 becomes unstable and undergoes oscillation.

As the collector-to-emitter voltage $V_{CE}$ of the transistors becomes so small as to cause the latter to be nearly saturated, the cutoff frequency $f_T$ of the transistors is lowered, allowing the high-frequency characteristics of the open loop to be largely varied by the amplitude of the input signal supplied, and hence to become poor in stability.

Figure 2B:
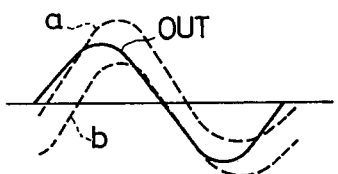

In order to prevent the foregoing difficulties, it is necessary to effect increased phase compensation in the class B amplifier 2 in the circuit shown in FIG. 1, to maintain the required stability. Such an arrangement, however, causes the high frequency characteristics of the class B amplifier 2 to become so poor as to differ appreciably from the frequency characteristics of the class A amplifier 1. The output and collector signals of the class A amplifier 1 will then have waveforms as illustrated in FIG. 2B, resulting in the malfunctioning of the amplifier circuit shown in FIG. 1.

Figure 3:
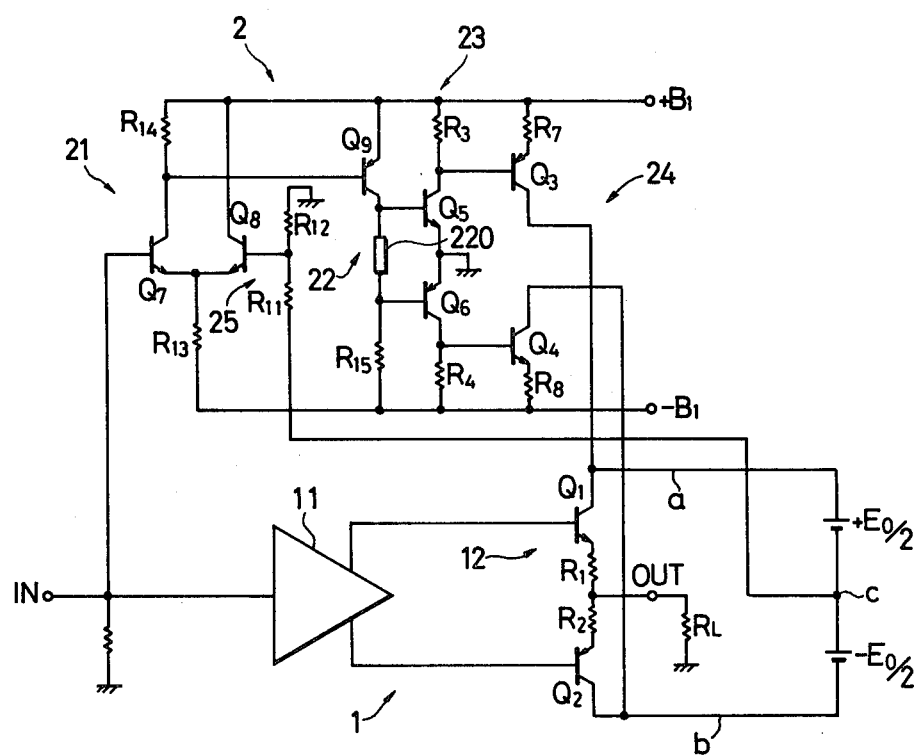
FIGS. 3, 4 and 5 are circuit diagrams of power amplifier circuits according to preferred embodiments of the present invention, respectively.

FIG. 3 shows a power amplifier circuit according to one embodiment of the present invention, wherein like or corresponding parts are denoted by like or corresponding reference characters of FIG. 1. The power amplifier circuit shown in FIG. 3 includes a class A power amplifier 1 which is of the same construction as the class A power amplifier 1 illustrated in FIG. 1. The power amplifier circuit also includes a class B amplifier 2 for power supply amplification having a voltage amplifying stage 21 in the form of a differential amplifier composed of transistors $Q_7$, $Q_8$ and resistors $R_{13}$, $R_{14}$. The resistor $R_{13}$ is coupled to both emitters of the transistors $Q_7$, $Q_8$ and the resistor $R_{14}$ is coupled to the collector of the transistor $Q_7$. An output from the collector of the transistor $Q_7$ via the resistor $R_{14}$ is supplied to a biasing stage 22 which comprises a transistor $Q_9$, a resistor $R_{15}$, and a biasing diode device 220. The biasing stage 22 produces an output that serves as a base control signal for a pair of complementary transistors $Q_5$, $Q_6$ which constitute a driver stage 23. The transistors $Q_5$, $Q_6$ have first controlled electrodes or emitters connected to a common potential point or grounded, and second controlled electrodes or collectors coupled via resistors $R_3$, $R_4$, respectively, to power supplies $+B_1$, $-B_1$ for applying drive inputs to a push-pull power amplifying stage 24.

The push-pull power amplifying stage 24 is in the form of a class B power amplifier comprising output transistors $Q_3$, $Q_4$ having collectors coupled respectively to collector terminals a, b of transistors $Q_1$, $Q_2$ in the output stage 12 of the class A push-pull amplifier 1. The collector terminals a, b are connected to the floating power supplies $+E_0/2$ and $-E_0/2$, respectively. A negative feedback circuit 25 which is composed of resistors $R_{11}$, $R_{12}$ is connected between the intermediate point c between the power supplies $+E_0/2$, $-E_0/2$ and an input of the differential amplifier 21.

With the arrangement of FIG. 3, the transistors $Q_1$, $Q_2$ operate in an active region at all times with the collector-to-emitter voltages $V_{ce}$ of the transistors $Q_1$, $Q_2$ being kept quite small, as in the amplifier circuit illustrated in FIG. 1. Thus, the power amplifier circuit shown in FIG. 3 has no switching distortion, an advantage obtained from the class A amplifying circuit 1, and consumes less power, an advantage gained by the class B amplifying circuit 2.

Collector-to-emitter voltages of the driver transistors $Q_5$, $Q_6$ in the driver stage 23 of the class B amplifying circuit 2 will now be studied in detail. When the input to the base of the transistor $Q_5$ is negative, the transistor $Q_5$ is de-energized. At this time, the collector-to-emitter voltage of the transistor $Q_5$ is $+B_1$ as the emitter thereof is grounded. When the base of the transistor $Q_5$ is positive, the transistor $Q_5$ is energized. However, the resistors $R_7$, $R_8$ are of small resistance, and the collector potential of the transistor $Q_5$ is at a value which is slightly smaller than the voltage $+B_1$. Therefore, the collector-to-emitter voltage $V_{CE}$ of the transistor $Q_5$ can range only from a potential slightly lower than the voltage $+B_1$ to the voltage $+B_1$. The foregoing operation also holds true for the transistor $Q_6$.

The variation in the collector-to-emitter voltage $V_{CE}$ of each of the transistors $Q_5$, $Q_6$ is only about half the variation in the collector-to-emitter voltage $V_{CE}$ of each of the transistors $Q_5$, $Q_6$ illustrated in FIG. 1, and the collector-to-emitter voltage is relatively smaller. Therefore, the transistors $Q_5$, $Q_6$ used in FIG. 3 may be of smaller dielectric strength. Since the parasitic capacitances $C_{ob}$ of the transistors vary to a smaller degree, nonlinearity due to variations in the parasitic capacitances has a reduced adverse effect on the frequency characteristics of the closed negative feedback loop formed by the negative feedback circuit 25, which is thus allowed to operate in a highly stable manner.

With the foregoing construction, there is thus no need to perform increased phase compensation in the class B amplifying circuit 2, and the high-frequency characteristics thereof are not impaired. The frequency characteristics of the class B amplifying circuit 2 remain the same as those of the class A amplifying circuit 1. The power amplifier circuit shown in FIG. 3 is therefore free from the malfunctioning illustrated in FIG. 2B.

The above advantages as imparted to the biasing or predriver stage 22 as well as the driver stage 23. Thus, the power amplifier circuit according to the present invention can be composed of transistors having a low dielectric strength, and has improved operating stability.

Figure 4:
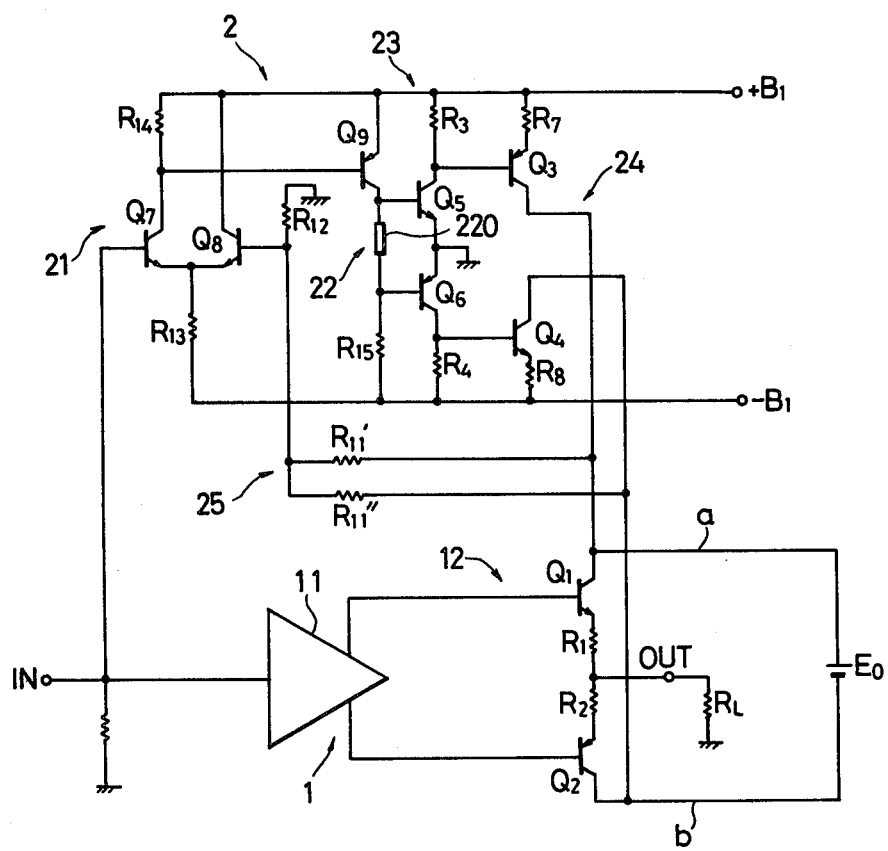

FIG. 4 illustrates a power amplifier circuit according to another embodiment of the present invention, wherein like or corresponding parts in FIG. 4 are identified by like or the corresponding reference characters of FIG. 3. The power amplifier circuit shown in FIG. 4 has a single floating power supply $E_0$ as a voltage source. A negative feedback loop is formed by resistors $R_{11}'$, $R_{11}''$ which are connected between the terminals of the floating power supply $E_0$ or the collector terminals a, b of the output transistors $Q_1$, $Q_2$ of the class A amplifying circuit 1 and an input of the differential amplifier 21. The remaining circuit arrangement is the same as that of the power amplifier circuit of FIG. 3.

The circuit arrangement of the power supply $E_0$ of the power amplifier circuit shown in FIG. 4 is simpler than that of the power amplifier circuit of FIG. 3. More specifically, since the power amplifier circuit of FIG. 3 includes power supplies for producing the voltages $+E_0/2$, $-E_0/2$, respectively, the power supply transformer needs to have a center tap c on its secondary winding, and rectifying and smoothing circuits are required for the positive and negative voltages. However, with the arrangement of FIG. 4, no center tap is necessary in the power supply transformer, a single rectifying and smoothing circuit suffices, and hence the overall circuit is relatively smaller in size. The other electrical characteristics of the power amplifier circuit shown in FIG. 4 are the same as those of the power amplifier circuit of FIG. 3.

Figure 5:
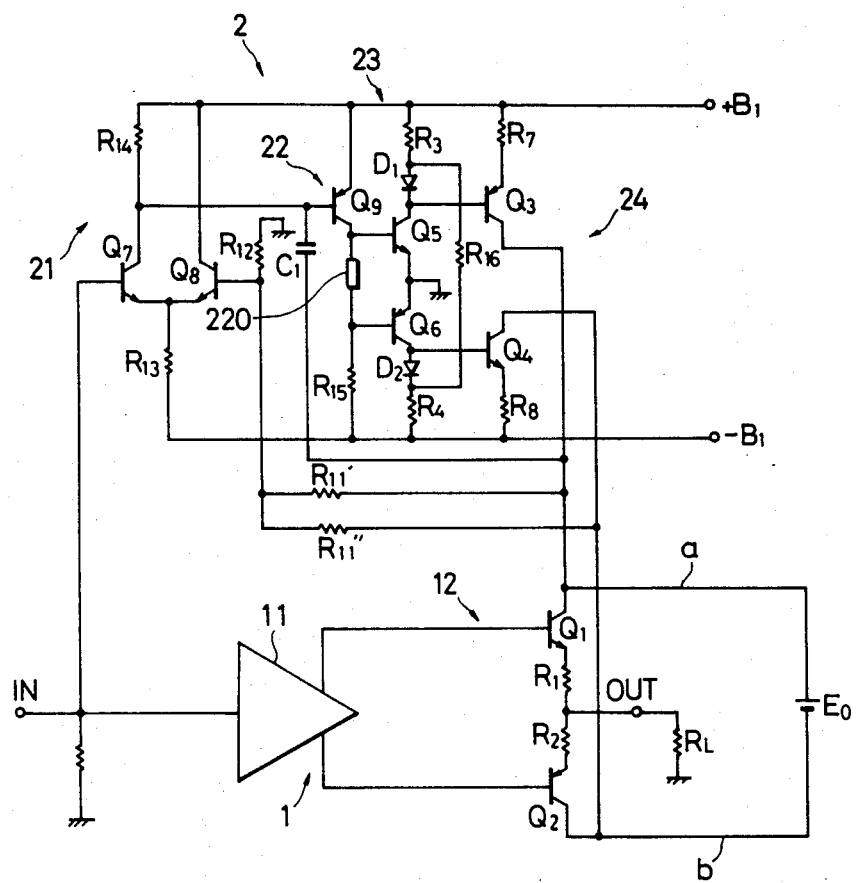

FIG. 5 is illustrative of a power amplifier circuit according to still another embodiment of the present invention. Identical parts in FIG. 5 are denoted by the characters of FIG. 4. The power amplifier circuit of FIG. 5 is different from that of FIG. 4 in that it additionally includes a circuit for preventing switching of the class B output transistors $Q_3$, $Q_4$, the circuit comprising a phase compensation capacitor $C_1$, a pair of diodes $D_1$, $D_2$, and a resistor $R_{16}$. The phase compensation capacitor $C_1$ serves to effect differential compensation and is connected between the output of the differential amplifier 21 and the collector output a of the transistor $Q_3$ to confine phase changes at high frequencies of the class B amplifying circuit 2 within 180 degrees for stability in the operation of the power amplifier circuit. The diodes $D_1$, $D_2$ are connected to the collectors, respectively, of the driver transistors $Q_5$, $Q_6$ in the driver stage 23. The diode $D_1$ has an anode which is coupled via the resistor $R_{16}$ to the cathode of the diode $D_2$. In operation, a small current flows through the resistor $R_{16}$ when the driver transistors $Q_5$, $Q_6$ are de-energized, with the result that base currents flow respectively through the series-connected circuit including the resistor $R_3$ and the diode $D_1$ and the series-connected circuit including the resistor $R_4$ and the diode $D_2$ to thereby slightly energize the transistors $Q_3$, $Q_4$. The transistors $Q_3$, $Q_4$ are therefore prevented from operating below a cutoff bias level, and effect no switching operation. The transistors $Q_3$, $Q_4$ thus operate at higher speeds.

The phase compensation capacitor $C_1$ and the switching prevention circuit as described above may also be incorporated in the power amplifier circuit shown in FIG. 3. While the amplifying devices have been shown as comprising bipolar transistors, they may be other active devices.

With the arrangement of the present invention, the power amplifier circuit has improved operating characteristics, and will remain stable in operation with negative feedback effected.

Although certain preferred embodiments have been shown and described, it should be understood that various changes and modifications amy be made therein without departing from the scope of the appended claims.

What is claimed is:
1. A power amplifier circuit comprising:
    a class A power amplifier (1) having a pair of output amplifying devices ($Q_1$, $Q_2$) responsive to an input for driving a load ($R_L$), said output amplifying devices having power supply terminals (a, b);
    a power supply ($E_o$) connected between said power supply terminals for producing a voltage; and
    a class B power amplifier (2) drivable by said input and having a pair of push-pull connected output amplifying devices ($Q_3$, $Q_4$) and including respective outputs connected to said power supply terminals, respectively, and a pair of amplifying devices ($Q_5$, $Q_6$) for driving said push-pull connected output amplifying devices, said amplifying devices having first controlled electrodes for driving said push-pull connected output amplifying devices, and second controlled electrodes directly connected to a common potential point.
2. A power amplifier circuit (25) according to claim 1, including a negative feedback loop for supplying signals dependent upon voltage changes at said power supply terminals back to an input stage (21) of said class B power amplifier.
3. A power amplifier circuit according to claim 2, wherein said negative feedback loop includes a pair of resistors ($R_{11}'$, $R_{11}''$) connected in parallel respectively to said power supply terminals.
4. A power amplifier circuit according to claim 1, further comprising biasing means (22) for providing a control signal to said driving amplifying devices.
5. A power amplifier circuit according to claim 4, said biasing means comprising a transistor ($Q_a$), a resis- tor ($R_{15}$) and a biasing diode device (220), said driving amplifying devices being transistors with the base of one of which connected to a point between said transistor and said diode device, and the base of the other of which connected to a point between said diode device and said resistor.

6. A power amplifier circuit according to claim 4, said class B power amplifier including a differential amplifier ($Q_7$, $Q_8$) providing an output to said biasing means.

7. A power amplifier circuit according to claim 6, including a negative feedback loop for supplying signals dependent upon voltage changes at said power supply terminals back to an input stage of said differential amplifier.

8. A power amplifier circuit according to claim 1, said power supply comprising a pair of series connected floating power supplies.

9. A power amplifier circuit according to claim 1, said power supply consisting of a single floating power supply, said amplifier circuit including a negative feedback loop being connected to an input stage of said class B amplifier and said loop including resistors connected to terminals of said power supply.

10. A power amplifier circuit according to claim 1, further including means for preventing switching of said push-pull connected output amplifying devices.

11. A power amplifier circuit according to claim 10, said switching preventing means comprising a phase compensating capacitor connected between an input stage of said class B amplifier and an output of one of said push-pull connected output amplifying devices.

12. A power amplifier circuit according to claim 11, said switching preventing means further including diode means connected to collectors of said driving amplifying devices, and a resistor connecting an anode of one said diode with a cathode of another said diode.

* * * * *